United States Patent [19]

Meisner et al.

[11] 4,222,010

[45] Sep. 9, 1980

[54] CONTROL DEVICE FOR RAPIDLY SETTING AN ELECTRONIC DIGITAL DISPLAY

[75] Inventors: Alfred Meisner; Werner Arnold, both of Nuremberg, Fed. Rep. of Germany

[73] Assignee: Firma DIEHL, Nuremberg, Fed. Rep. of Germany

[21] Appl. No.: 911,756

[22] Filed: Jun. 2, 1978

[30] Foreign Application Priority Data

Jun. 10, 1977 [DE] Fed. Rep. of Germany ....... 2726383

[51] Int. Cl.[2] ........................ H03K 1/16; H03K 17/30

[52] U.S. Cl. ...................................... 328/140; 328/61; 328/138; 328/154; 368/188

[58] Field of Search ................... 328/60, 61, 138, 140, 328/133, 154; 307/233 R; 58/85.5

[56] References Cited

U.S. PATENT DOCUMENTS

| | | | |
|---|---|---|---|
| 3,093,797 | 6/1963 | Lubkin | 328/61 |
| 3,187,202 | 6/1965 | Case | 328/138 X |
| 3,382,376 | 5/1968 | Sowden | 307/233 |
| 3,413,490 | 11/1968 | Breunig et al. | 307/233 |
| 3,500,375 | 3/1970 | Klimo | 328/138 X |
| 3,778,638 | 12/1973 | Garratt | 307/233 |
| 4,068,216 | 1/1978 | Brouwer et al. | 328/138 X |

*Primary Examiner*—John S. Heyman

*Attorney, Agent, or Firm*—Burns, Doane, Swecker & Mathis

[57] ABSTRACT

In an electronic digital display control device, a pulse generator is actuated to produce pulses which are fed into a counter to control the setting on the display. A discriminator detects whether the frequency of the pulses exceeds a predetermined frequency limit. If the limit is exceeded, the discriminator connects to the counter a second pulse generator which provides pulses at a freqency higher than the predetermined frequency limit. By so doing, the counter receives a substantially greater number of control pulses per unit of time and sets the digital display very rapidly.

9 Claims, 10 Drawing Figures

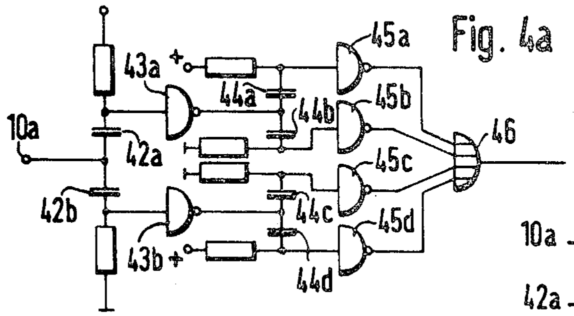
Fig. 4a
Fig. 4b
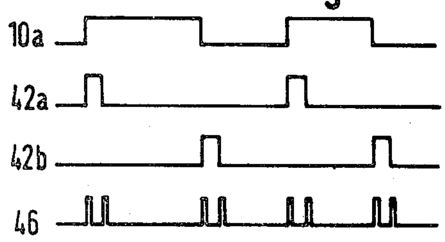
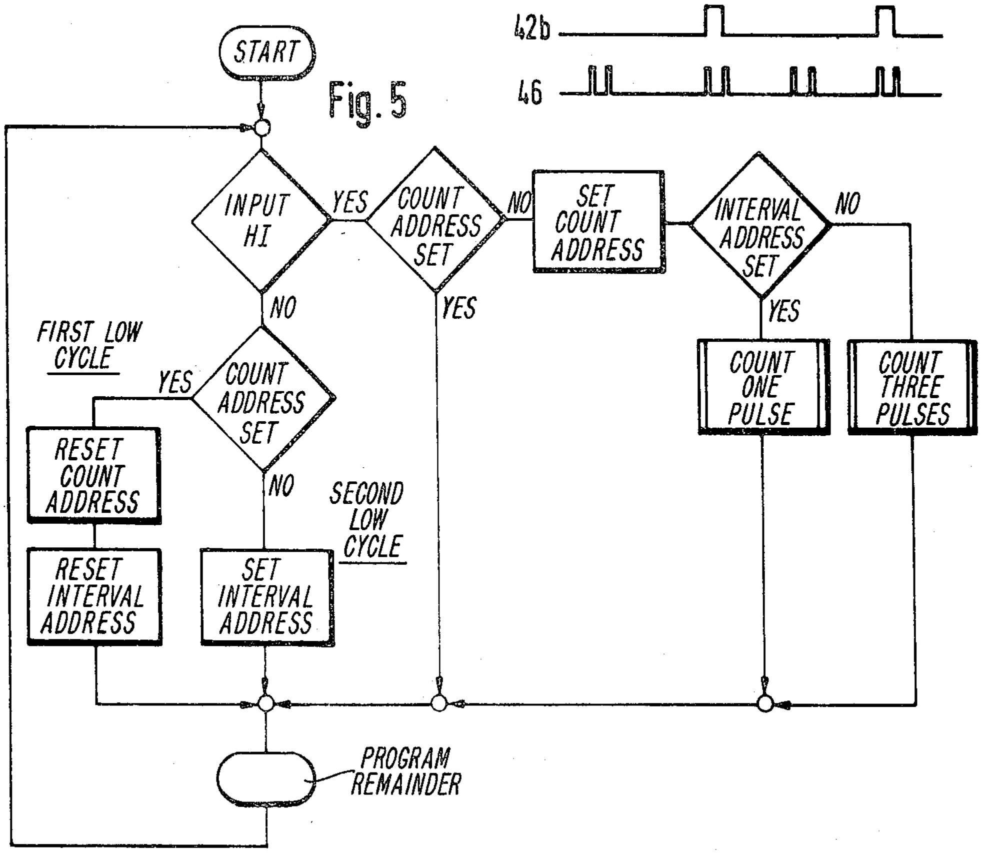
Fig. 5
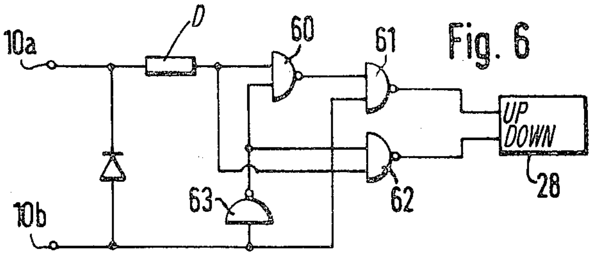
Fig. 6

CONTROL DEVICE FOR RAPIDLY SETTING AN ELECTRONIC DIGITAL DISPLAY

BACKGROUND OF THE INVENTION

The present invention relates to a control device for an electronic digital display in an electronic instrument, particularly a timing unit. The device includes a first pulse generator to produce counting pulses, an electronic counting unit comprising one or more pulse counters, a display control device operated by at least one control element and comprising a second pulse generator which consists of a pulse transmitter having one or more pulse generating elements connected to it and an electrical counter. The pulse generating element or elements and the counter can be moved relative to each other to produce electric pulses of varying pulse frequency for the control of a display.

A control device of this type is disclosed in U.S. Pat. No. 4,091,612, which describes a set of pulse generators which produce pulses for resetting an electronic digital display. The input rate of these pulse generators is limited to approximately 200 pulses per second. Therefore, in order to reset the display of a timing unit by several hours, the pulse generator must go through a considerable number of turns until the desired display figure is reached, a process which is not conveneint for the person operating the unit.

The input rate of the disclosed pulse generator can not be increased without the use of special measures, due to mechanical difficulties concerning the contacts, particularly impact phenomina. Furthermore, the processing time problems of the electronics limit the rate of pulse generation.

This last mentioned difficulty will arise if a microprocessor is being used which must perform, in addition to the handling of the input pulses for the digital display, a number of operations controlling the electronic instrument. The microprocessor must carry out its various programmed tasks during a series of cycles by interrogating the relevant data during each program cycle, for example, the information originated by the second pulse generator. The microprocessor can therefore acquire the data of the second pulse generator only during a brief period of time within its program cycle, while the period of time before the next program cycle is relatively long. If the pulse generation by the second pulse generator is accomplished quickly, the pulses so generated will occur at a period of time during which the microprocessor is not interrogating the second pulse generator, and the corresponding pulses will then be lost.

OBJECT AND BRIEF SUMMARY OF THE INVENTION

It is an object of the present invention to provide a display control device which utilizes known pulse generators and makes it possible in a simple and easy manner to produce pulses very rapidly, thereby reducing the time for setting a display.

The present invention achieves this by providing a discriminator which determines whether the pulse frequency of the pulses produced by the second pulse generator exceeds a pre-determined limit value. A third pulse generator is used and can be connected by the discriminator to the display when the limit value is exceeded, to transmit to the display a greater number of pulses.

Beginning at a specific frequency of the pulses produced by the second pulse generator, an electronic frequency generator is actuated within the system to produce pulses much more rapidly than the second pulse generator, to be transmitted to the display. This means that, beginning at the specific pulse frequency, the pulse generation will no longer be limited by the output rate of the second pulse generator and the display can therefore be reset very rapidly.

In a preferred embodiment of the present invention, a sensing element for interrogation of the pulse-generating elements is provided in connection with a control device wherein the pulse transmitter of the second pulse generator comprises several pulse-generating elements. The pulse-generating elements and the sensing element can be shifted relative to each other, either manually or by power means, and the discriminator is electrically connected with the sensing element which interrogates the pulse generating elements. Preferably a pulse-controlling wheel, operated manually or by power means, produces the control pulses for the display.

It is also possible to design the pulse transmitter of the second pulse generator in the form of a sliding lever which glides with a sliding contact across a resistance track similar to a potentiometer, to provide a change in the pulse frequency of an oscillator by changing the oscillator circuit resistance.

Another preferred embodiment of the invention utilizes as the third pulse generator a unit which forms a basic part of the electronic instrument and which generates pulses at a higher frequency then the predetermined limit frequency. For example, the frequency divider or the multiplexer for the display can be used.

Figure 2:
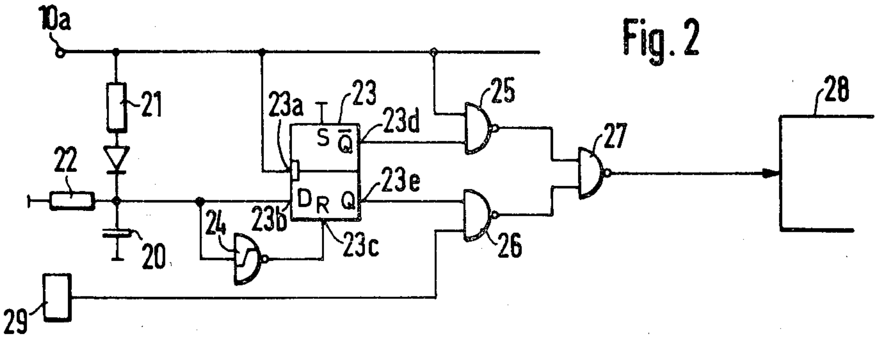
FIG. 2 illustrates a first embodiment of the invention wherein an RC circuit is provided in the discriminator as a time-determining element.
Figure 3:
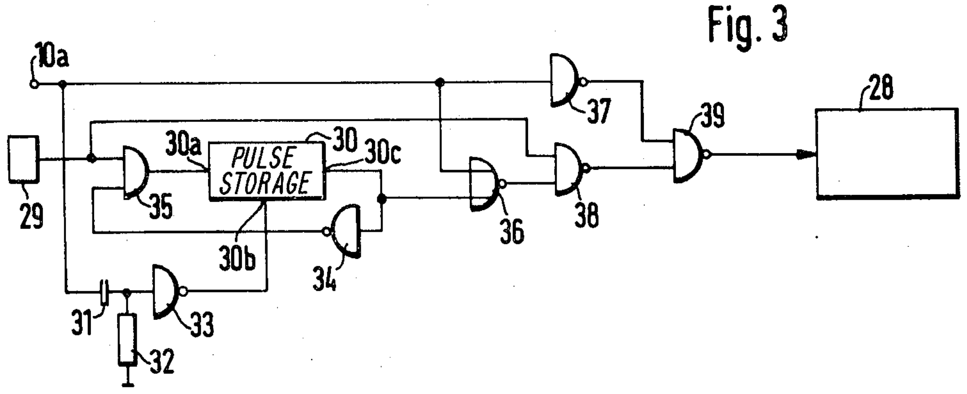
Figure 4:
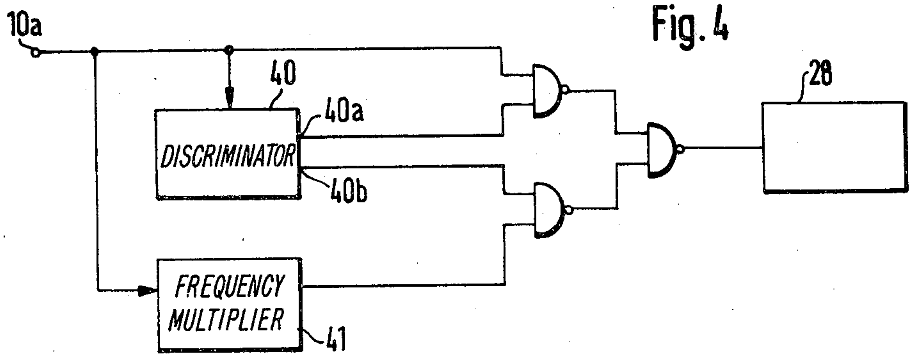

FIG. **2*a* is a graph of pulses produced by the embodiment of FIG. 2**;

FIG. 3 shows a second embodiment of the invention having a shift register in the discriminator to act as a time-determining element;

FIG. **3*a* is a graph of pulses produced by the embodiment of FIG. 3**;

FIG. 4 illustrates a third embodiment of the invention, having a discriminator as shown in FIG. 2 and a frequency multiplier;

FIG. **4*a*** shows one example of a frequency multiplier;

FIG. 5 is a flow chart for a fourth embodiment of the invention which uses microprocessor; and, FIG. 6 illustrates a circuit for processing the forward and reverse counting pulses of the second pulse generator.

DETAILED DESCRIPTION

Figure 1:
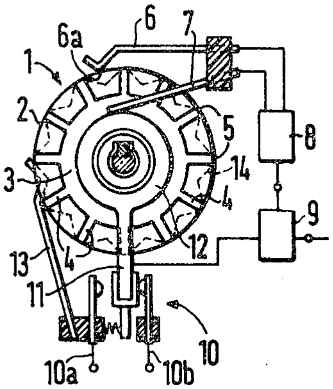
FIG. 1 illustrates a pulse wheel used as second pulse generator in connection with the control device.

Referring to FIG. 1, a pulse generator for producing control pulses is denoted by numeral 1. It includes a pulse wheel 2 made of insulative material, preferably wear resistant plastic, with an electrically conductive contact ring 3 which carries a number of radially arranged electrically conductive contact sections 4. These contact sections extend radially and outwardly to the flat peripheral surface of the pulse wheel 2, forming along their outer profiles contact surfaces 5, which are utilized for pulse generation. A contact spring 6, resting at the flat peripheral surface of the pulse wheel 2 is able to slide along its tap 6*a* without any bounce when the wheel is turned. This contact spring 6 and a contact spring 7, which slides over the contact ring 3 to close an electrical circuit, are designed in the form of leaf springs. One end of each spring is clamped and connected to a pulse shaper 8. The pulse shaper 8 is connected to a signal path selector switch 9 which is in turn connected with a switch-over device 10 for forward and reverse counting pulses. This device comprises an arm 11 which is in communication with the pulse wheel by means of a coupling (not shown) and a switching disk 12. The arm 11 touches either a contact 10*a* or a contact 10*b* of the switch-over device 10, depending on the direction of rotation of the pulse wheel 2, to transmit the forward or reverse pulses of the pulse wheel to one of the two contacts. Numeral 13 denotes a stop spring which engages notches 14 in the pulse wheel 2.

The pulse generator is described in more detail in copending U.S. application Ser. No. 721,467, filed on Sept. 8, 1976, the disclosure of which is hereby incorporated by reference.

Pulse generator 1 is the second pulse generator of the control device and is preferably used for setting the digital display of a clock. It is also suitable in general for setting the display of any electronic instrument. The remaining components of a control device, i.e. the display, the first pulse generator, and the pulse counters are not illustrated here since these components are known per se and were explained previously with respect to the cited German patent application.

FIG. 2 depicts a first embodiment of the invention wherein the pulses generated by a pulse generator, such as that shown in FIG. 1, are analyzed to determine whether or not they exceed a pre-determined limit frequency. An RC circuit is used for this purpose. The charge on the circuit during the pulse interval between two successive input pulses is used for discrimination of the limit frequency.

A storage condenser 20 is connected by way of a charging resistor 21 to the output terminal 10*a* of the second pulse generator 1. A bleeder resistor 22 serves to discharge the condenser 20. Numeral 23 denotes a D-type flip-flop which comprises a clock-pulse input terminal 23*a*, a data input terminal 23*b*, a reset input terminal 23*c*, a true output terminal 23*e* and a false output terminal 23*d*. Between the input terminals 23*b* and 23*c* of the flip-flop unit is connected an inverting threshold element 24, for example a Schmitt trigger. The output terminals 23*d* and 23*e* of the flip-flop unit are connected to NAND-gates 25, 26 and 27. The output of the latter gate is connected to a counter 28 which is one of the pulse counters of the electronic instrument, for example, the minute counter of a clock. A third pulse generator 29 produces a frequency that is greater than the pre-set cut-off frequency. The frequency of this pulse generator 29 can be 600 cycles per second, for example. This pulse generator can be either an independent pulse source or it can transmit a frequency derived from the first pulse generator of the electronic instrument, for example from the crystal or the mains frequency pulse transmitter.

The operating mode of the species depicted by FIG. 2 will now be explained with reference to the graph of FIG. 2*a*. The reference numerals appearing next to the individual pulse trains of FIG. 2*a* denote the components of FIG. 2 which produce these pulses at their output terminals. An input pulse at the terminal 10*a* of the pulse generator 1 will be present at the condenser 20 by way of the charging resistor 21 and also at the clock pulse input terminal 23*a* of the flip-flop unit 23. The leading edge of this pulse can not trigger the flip-flop due to the presence of a reset signal across the input terminal 23*c* which goes to the low state when the condenser 20 is charged, i.e. when the threshold level of the threshold element 24 is exceeded. The signal across the input terminal 23*b* does not change the flip-flop and there is no signal produced at the output terminal 23*e*. The signal at the output terminal 23*d* causes the transmission of the input signal to the counter 28 by way of the NAND gates 25 and 27. After the termination of the intput signal 10*a* the condenser 20 discharges, and when the charge value falls below that of the threshold value of element 24, a reset signal is present at the input terminal 23*c* of the flip-flop unit. The signal across the input terminal 23*b* goes to the low state.

When the leading edge of a second input signal appears at the terminal 10*a*, the above-described action is repeated. However, if this signal has a substantially shorter duration and a substantially shorter successive pulse interval than the preceding signal, the condenser does not discharge to such a degree that the charge value falls short of the triggering threshold of the threshold element 24. A reset signal will therefore not be present at the input terminal 23*c* when the next input pulse appears at the terminal 10*a* and the leading edge of this input signal is now able to trigger the flip-flop unit 23 so that a signal will appear at the output terminal 23*e* while the signal at output terminal 23*d* of the flip-flop unit disappears. This triggering of the flip-flop unit 23 indicates that the input pulse frequency was greater than the pre-set limit frequency and that the increased pulse frequency of the third pulse generator 29 is to be transmitted to the counter 28 by way of the NAND gate 26 and the NAND gate 27.

Figure 2A:
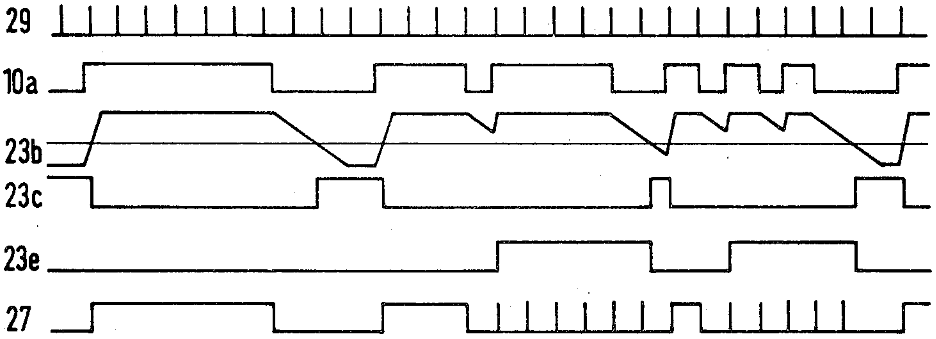

FIG. 2*a* shows that the first input pulse and the successive pulse interval are longer than the respective limit frequency so that the discharge of the condenser 20 proceeds to such an extent that the charge value falls below the triggering threshold of the threshold element 24. A reset signal will reappear at the input terminal 23*c* of the flip-flop unit 23, resetting the flip-flop 23. The pulse frequency of the next input pulse is substantially greater than the limit frequency. As a result, the condenser does not discharge to such an extent that its charge value will fall below the triggering threshold of the threshold element 24. This means that the flip-flop unit 23 is triggered and the increased pulse frequency of the pulse generator 29 is transmitted to the counter 28.

The previous explanations demonstrates that the circuitry of FIG. 2 operates as a discriminator for frequencies that are greater or smaller than the pre-set limit frequency. Due to the transmission of the higher frequency pulses of the pulse generator to the counter 28, there is present at this counter a substantially greater number of control pulses than actually produced by the pulse transmitter 1. In this manner it becomes feasible to set the digital display very quickly.

FIG. 3 depicts a second embodiment of the invention wherein the discriminator includes a unit for storing a predetermined number of pulses, for example four pulses. This unit comprises a time-determining element which cooperates with a logic circuit connected to it in series. A storage unit 30, which could be a shift register or a counter, is continuously supplied at its input terminal with pulses from a third pulse generator 29. This pulse generator 29 can be the same pulse source as in the embodiment shown by FIG. 2. The terminal 10*a* is connected with the reset input terminal 30*b* of the storage unit 30 by way of a differentiator 31, 32 and an inverter 33 which prevents negative spikes from being passed. The output 30*c* of the storage unit 30 is connected with its input terminal 30*a* by way of an inverter 34 and an AND gate 35. This feedback blocks additional input pulses from the pulse generator 29 when an output signal is produced at the output terminal after receiving the fourth pulse. The output terminal of the storage unit 30 is connected to a NOR gate 36. An inverter 37 and two NAND gates 38, 39 control the input of pulses to the counter 28.

Figure 3A:
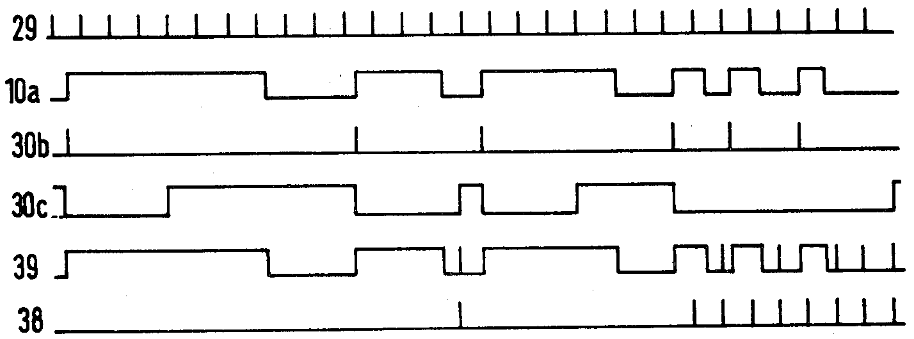

The graph in FIG. 3*a* shows that only the pulses from the pulse generator are transmitted from the terminal 10*a* to the input terminal of the counter 28 when the time period for successive pulses is greater than the time necessary for the four pulses to be fed into the storage unit 30. In this case, reset pulses 30*b* are produced at the beginning of a new pulse 10*a*. This marks the beginning of the pulse feeding operation of the storage unit 30 since the output signal 30*c* goes low. If the pulse period is smaller than the time necessary to feed four pulses into the storage unit 30, the output signal 30*c* will still be zero when the pulse 10*a* goes low. This means that a pulse from the third frequency generator 29 is transmitted through the NAND gate 38 to the counter 28 as an additional control pulse. The graph further demonstrates that in the case of a very rapid rotation of the second pulse generator, i.e. very brief pulses 10*a*, the number of additional pulses which will advance the counter 28 is approximately doubled.

FIG. 4 shows a third embodiment of the invention with a discriminator 40 similar to that of FIG. 2. In this embodiment, the output terminals 40*a* and 40*b* of the discriminator correspond to the output terminals 23*d* and 23*e* of the flip-flop unit 23 shown in FIG. 2. A frequency multiplier 41 which multiplies the pulses 10*a* fourfold is provided in the place of the third pulse-frequency generator 29.

FIGS. 4*a* and 4*b* illustrate the details and mode of operation of the frequency multiplier 41. The pulses 10*a* are differentiated at their leading and trailing edges by the condensers 42*a* and 42*b*, to produce two pulses 42 from one pulse 10*a*. These pulses are fed by way of inverters 43*a* and 43*b* into additional differentiating condensers 44*a*, 44*b*, 44*c*, 44*d*, to produce, by means of further differentiation of the leading and trailing edges, a total of four pulses from each original clock pulse 10*a*. These signals are inverted in the inverters 45*a*, 45*b*, 45*c*, 45*d* and linked together by way of a NOR gate 46.

If the second pulse generator 1 is connected by way of its terminals 10*a* and 10*b* to a microprocessor, the processor will perform the discrimination function. A flow chart which explains this operation of the microprocessor is shown in FIG. 5. The program illustrated in FIG. 5 will be repeated at certain time intervals within the framework of a complete program carried out by the microprocessor. These time intervals are set to fit the previously defined limit frequency of the pulses. At the beginning of each program cycle, the address is set for counting, and the input signal 10*a*, or 10*b* respectively, is queried as to the state of the signal (input hi?). If the input signal is not "hi", and therefore "low", the first "low" cycle is carried out by resetting the address for counting and by also resetting an address for large intervals between the pulses 10*a* or 10*b* respectively. The remaining program of the microprocessor is then carried through for one cycle. After approximately five milliseconds, the input is again queried: input hi?. If the answer is "no", the second "low" cycle is carried out since the address is not set for counting. The address is set for a large interval between the pulses 10*a* or 10*b* in this cycle. With the input signal being low two times in a row, a large interval between pulses 10*a* or 10*b* and therefore a pulse frequency lower than the limit value has been detected. If now the third input signal query (input hi?) receives the answer "yes", the right-hand portion of the flow chart is carried out. The address has not been set for counting in this case, making it necessary to set this address at this point. The address for large intervals had been previously set in the second "low" cycle so that the corresponding inquiry is answered by "yes", resulting in one pulse being counted in the counter 28.

If, however, the input signal is "hi" at the time of the second program cycle, meaning that the second "low" cycle was not carried out, the right-hand portion of the flow chart is carried out. The address for large intervals between the pulses is not set in this case since the second "low" cycle was not carried out. In this situation three pulses are added to the counter 28, indicating that the pulse frequency of the pulses 10*a* and 10*b* is greater than the limit frequency.

In the event that the pulse generator 1 is to be used for the forward and reverse control of the display, it is necessary to distinguish between the pulses at the terminals 10*a* or 10*b* of the second pulse generator. In such a case, the counter 28 is provided with one UP and one DOWN counting input. The circuit shown in FIG. 6 serves to select the "correct" input terminal of the counter 28, depending on the presence of the pulses at the terminal 10*a* or the terminal 10*b* of the switch-over unit 10. The symbol D denotes the discrminator which comprises an arrangement such as those shown in FIG. 2 or 3, including the third pulse generator 29. The discriminator D is connected to the counter 28 by NAND gates 60, 61 and 62. Numeral 63 denotes an inverter which inverts the reset signal.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. In a control device for a digital display unit in an electronic instrument, including a first pulse generator having first and second relatively moveable elements for producing a variable frequency output signal and a counter for receiving and counting the pulses produced by said first pulse generator, the improvement comprising:

discriminator means for determining whether the frequency of pulses produced by said first pulse generator exceeds a predetermined frequency value; and a second pulse generator which produces an output signal having a frequency greater than said predetermined frequency value and which is adapted to be connected to an input terminal of said counter by said discriminator means when said predetermined frequency value is exceeded, whereby said counter receives the greater frequency output signal produced by the second pulse generator when the frequency of pulses produced by the first pulse generator exceeds the predetermined frequency value.

2. The control device of claim 1 wherein said first pulse generator includes a moveable member having a plurality of pulse generating elements and a sensing member for detecting movement of said pulse generating elements and producing pulses in response thereto, further wherein said discriminator means is connected to said sensing member for receiving the pulses produced.

3. The control device of claim 1 wherein said second pulse generator is formed by a pulse generating unit of said electronic instrument.

4. The control device of claim 1 wherein said discriminator means includes a logic circuit for connecting said second pulse generator to said counter.

5. The control device of claim 4 wherein said discriminator means includes an RC timing circuit connected to said logic circuit, said logic circuit connecting said second pulse generator to said counter when the time interval between two successive pulses is less than the time constant of said RC circuit.

6. The control device of claim 4 wherein said discriminator means includes means for storing a predetermined number of pulses produced by said second pulse generator, further wherein said logic circuit adds the pulses produced by said second pulse generator to those produced by said first pulse generator whenever the time period for two successive pulses of said first pulse generator is less than the time necessary to store said predetermined number of pulses.

7. The control device of claim 1 wherein said second pulse generator comprises a frequency multiplier.

8. The control device of claim 1 wherein said discriminator means includes a microprocessor programmed to evaluate the pulse frequency of said first pulse generator.

9. In a control device for a digital display unit in an electronic instrument, including a first pulse generator having first and second relatively moveable elements for producing a variable frequency output signal and a counter for receiving and counting the pulses produced by said first pulse generator, the improvement comprising:

discriminator means for determining whether the frequency of pulses produced by said first pulse generator exceeds a predetermined threshold value; and a second pulse generator adapted to be connected to an input terminal of said counter by said discriminator means when said threshold value is exceeded;

wherein said discriminator means includes a logic circuit for connecting said second pulse generator to said counter, and means for storing a predetermined number of pulses produced by said second pulse generator; and wherein said logic circuit adds the pulses produced by said second pulse generator to those produced by said first pulse generator whenever the time period for two successive pulses of said first pulse generator is less than the time necessary to store said predetermined number of pulses.

* * * * *